United States Patent
Dogruoz et al.

(10) Patent No.: US 11,940,233 B2
(45) Date of Patent: Mar. 26, 2024

(54) GRAPHENE AND CARBON NANOTUBE BASED THERMAL MANAGEMENT DEVICE

(71) Applicant: CISCO TECHNOLOGY, INC., San Jose, CA (US)

(72) Inventors: M. Baris Dogruoz, Campbell, CA (US); Mehmet Onder Cap, Sunnyvale, CA (US); D. Brice Achkir, Livermore, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 311 days.

(21) Appl. No.: 17/154,785

(22) Filed: Jan. 21, 2021

(65) Prior Publication Data

US 2022/0228820 A1    Jul. 21, 2022

(51) Int. Cl.
*F28F 21/02*  (2006.01)
*F28D 21/00*  (2006.01)
*F28F 3/04*   (2006.01)

(52) U.S. Cl.
CPC .............. *F28F 21/02* (2013.01); *F28D 21/00* (2013.01); *F28F 3/04* (2013.01); *F28D 2021/0029* (2013.01); *F28F 2280/06* (2013.01)

(58) Field of Classification Search
CPC .......... F28F 21/02; F28F 3/04; F28F 2280/06; F28F 2260/00; F28D 21/00; F28D 2021/0029; H01K 1/58; H01L 23/3677; H01L 23/373; H01L 23/4006
USPC ....................................................... 165/185
See application file for complete search history.

(56) References Cited

U.S. PATENT DOCUMENTS

| | | | |
|---|---|---|---|
| 7,616,441 B2* | 11/2009 | Horng ........................ | F28F 3/02 165/104.34 |
| 7,944,695 B2* | 5/2011 | Nuki ....................... | H05K 7/209 257/718 |
| 9,597,657 B1* | 3/2017 | Zhamu ...................... | C09K 5/14 |
| 2006/0033203 A1 | 2/2006 | Leu | |
| 2011/0114894 A1* | 5/2011 | Choi ....................... | B82Y 30/00 252/502 |
| 2011/0121264 A1* | 5/2011 | Choi .................... | H01L 29/1606 252/502 |
| 2012/0152725 A1* | 6/2012 | Barker .................. | C01B 32/184 204/157.44 |
| 2013/0264041 A1 | 10/2013 | Zhamu | |
| 2014/0127584 A1* | 5/2014 | Kim ....................... | B82B 3/0033 427/113 |

(Continued)

FOREIGN PATENT DOCUMENTS

| | | | | |
|---|---|---|---|---|
| CA | 3064744 A1 | * | 11/2018 | ............ B01L 3/5088 |
| CN | 105819420 A | * | 8/2016 | ............ B01J 21/185 |

(Continued)

OTHER PUBLICATIONS

Machine Translation JP 2010192780A (Year: 2010).*

(Continued)

*Primary Examiner* — Len Tran
*Assistant Examiner* — Gustavo A Hincapie Serna

(57) ABSTRACT

In one embodiment, a thermal management device includes a heat sink base and heat sink fins comprising a single element formed from a plurality of graphene layers with carbon nanotubes interposed between the graphene layers. A method is also disclosed herein.

20 Claims, 7 Drawing Sheets

(56) References Cited

U.S. PATENT DOCUMENTS

| | | | |
|---|---|---|---|
| 2014/0284040 A1* | 9/2014 | Colgan | H05K 7/20509 165/185 |
| 2015/0257308 A1 | 9/2015 | Li | |
| 2015/0357470 A1* | 12/2015 | Cheng | H01L 29/785 257/401 |
| 2016/0215172 A1* | 7/2016 | Morita | C09J 201/00 |
| 2017/0182474 A1* | 6/2017 | Zhamu | B01J 20/20 |
| 2017/0194596 A1* | 7/2017 | Shen | H01L 51/5237 |
| 2018/0040532 A1* | 2/2018 | Wu | H01L 23/3732 |
| 2018/0175272 A1* | 6/2018 | Imai | H10N 10/13 |
| 2018/0183360 A1* | 6/2018 | Suzuki | H02N 11/002 |
| 2019/0044042 A1* | 2/2019 | Nakada | H10N 10/13 |
| 2019/0088383 A1* | 3/2019 | Zhamu | C01B 32/184 |
| 2019/0098743 A1* | 3/2019 | Molla | H01L 23/3735 |
| 2021/0092871 A1* | 3/2021 | Hur | H05K 7/20163 |
| 2021/0378106 A1* | 12/2021 | Iyengar | H01L 23/562 |
| 2022/0024766 A1* | 1/2022 | Parker | C01B 32/184 |
| 2022/0068767 A1* | 3/2022 | Khalil | H01L 23/4824 |

FOREIGN PATENT DOCUMENTS

| | | | | |
|---|---|---|---|---|
| CN | 212231980 U | * | 12/2020 | |
| EP | 3136434 A1 | * | 3/2017 | ............ H01L 23/373 |
| EP | 3136434 A1 | | 3/2017 | |
| EP | 3723464 A1 | * | 10/2020 | ........... F28D 1/0366 |
| GB | 2546016 A | * | 7/2017 | ............. B22F 10/00 |
| JP | 2010192780 A | * | 9/2010 | |
| JP | 2017041483 A | * | 2/2017 | |
| KR | 2020014264 A | * | 2/2020 | ............. B29C 33/00 |

OTHER PUBLICATIONS

Covalently Bonded Graphene-Carbon Nanotube Hybrid for High-Performance Thermal Interfaces, https://onlinelibrary.wiley.com/, Jie Chen, Jens H. Walther, Petros Koumoutsakos, Nov. 17, 2015.

Thermal Conductivity from Hierarchical Heat Sinks Using Carbon Nanotubes and Graphene Nanosheets, Nanoscale, The Royal Society of Chemistry, 2012.

Ismail, F. et al., CFD Analysis for Optimum Thermal Design of a Carbon Nanotube Based Micro-channel Heatsink, Engineering Journal, vol. 15, Issue 4, Oct. 1, 2011.

Farzanehnia, A. et al., Experimental investigation of multiwall carbon nanotube/paraffin based heat sink for electronic device thermal management, Energy Conversion and Management 179 (2019) 314-325, Oct. 29, 2018.

Liu, J. et al., Carbon nanotubes for electronics manufacturing and packaging: from growth to integration, Adv. Manuf. (2013) 1:13-27.

* cited by examiner

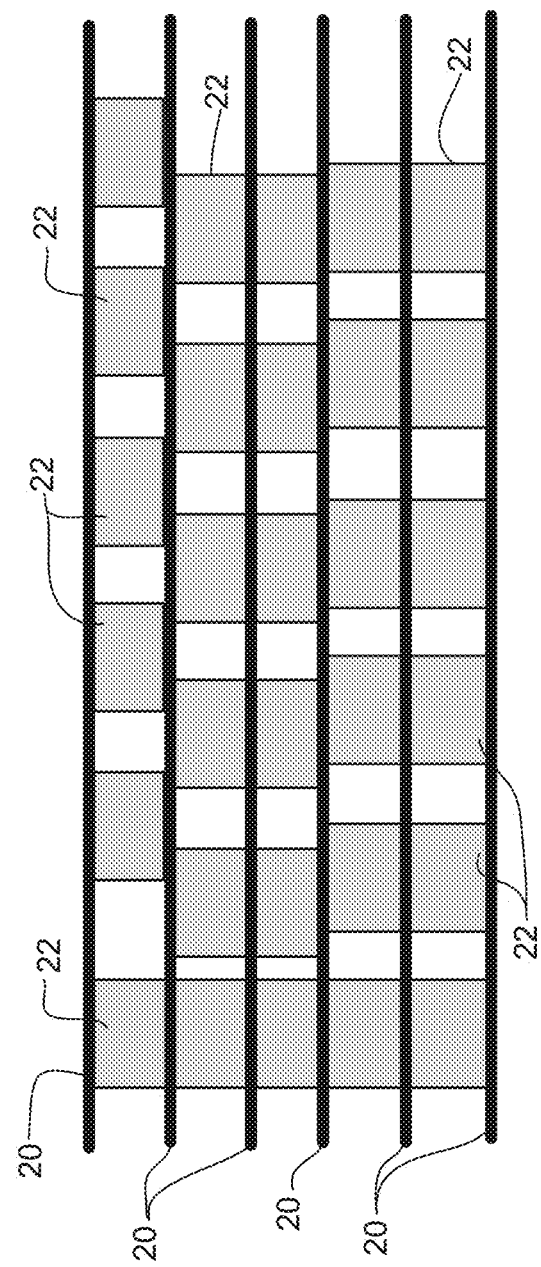

GRAPHENE AND CARBON NANOTUBE
BASED THERMAL MANAGEMENT DEVICE

TECHNICAL FIELD

The present disclosure relates generally to thermal management, and more particularly, to a graphene and carbon nanotube based thermal management device.

BACKGROUND

Over the past several years, there has been a tremendous increase in the need for higher performance communications networks. Increased performance requirements have led to an increase in energy use resulting in greater heat dissipation from components. High power components such as ASICs (Application Specific Integrated Circuits) require high performance thermal management.

BRIEF DESCRIPTION OF THE DRAWINGS

FIG. 2C is a simplified side view illustrating offset carbon nanotube arrays between the graphene layers.

Corresponding reference characters indicate corresponding parts throughout the several views of the drawings.

DESCRIPTION OF EXAMPLE EMBODIMENTS

Overview

Figure 1:
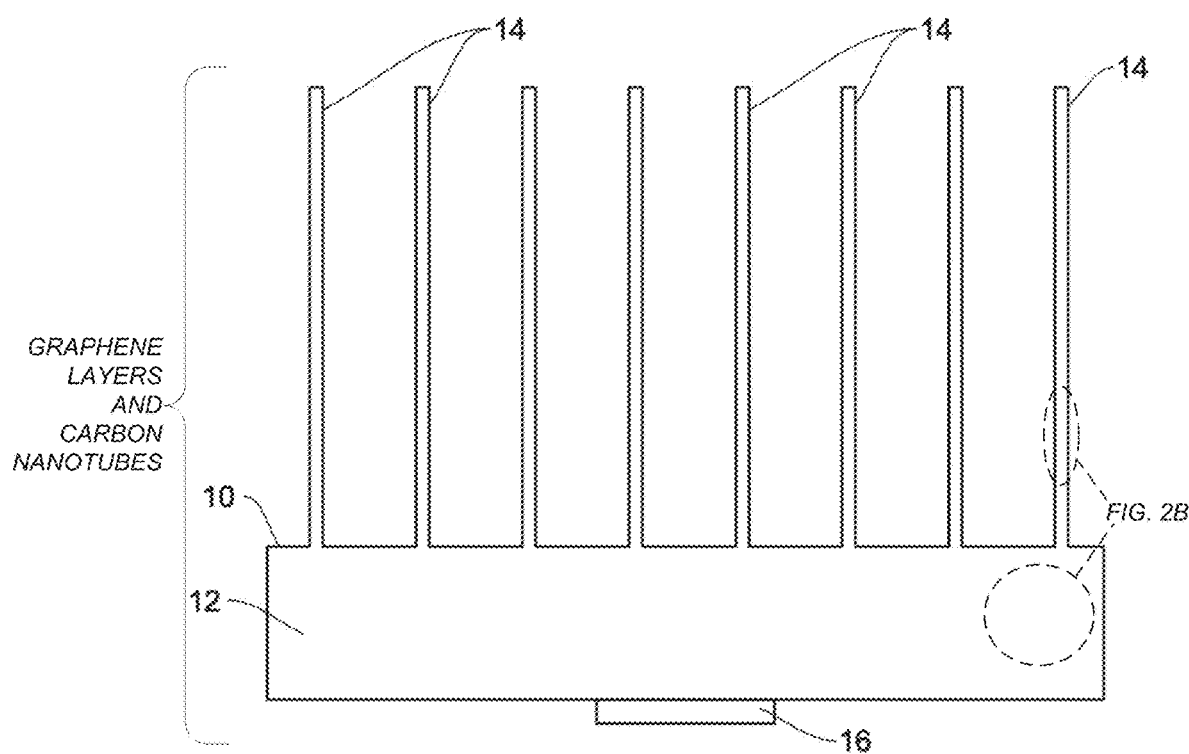
FIG. 1 is a schematic side view of a graphene and carbon nanotube based heat sink, in accordance with one embodiment.

In one embodiment, a thermal management device generally comprises a heat sink base and heat sink fins comprising a single element formed from a plurality of graphene layers with carbon nanotubes interposed between the graphene layers.

In one embodiment, the heat sink base comprises a pedestal for direct contact with an integrated circuit package, which may comprise a lidless integrated circuit package.

In one embodiment, the thermal management device further comprises a frame configured for mounting on a printed circuit board and supporting the heat sink base. The frame may comprise a shock absorbing material and at least two side walls extending upward from the frame and positioned adjacent to the heat sink fins.

In one embodiment, the thermal management device is configured for direct contact with an integrated circuit package without a thermal interface material interposed therebetween.

In one embodiment, an apparatus generally comprises a printed circuit board, an integrated circuit package mounted on the printed circuit board, a heat sink formed from a plurality of graphene layers with carbon nanotubes interposed between the graphene layers, and a frame mounted on the printed circuit board, wherein the heat sink is positioned on the frame and in direct contact with the integrated circuit package through an opening in the frame.

In yet another embodiment, a method generally comprises creating an element comprising a plurality of graphene layers and carbon nanotubes interposed between the graphene layers and removing material from the element to define heat sink fins integrated with a heat sink base. The graphene layers provide in-plane thermal conductivity and the carbon nanotubes provide through-plane thermal conductivity.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

High power components such as ASICs (Application Specific Integrated Circuits) often need high performance heat sinks to quickly dissipate and spread excessive heat to fins, which may be cooled via forced airflow or immersion cooling in a liquid, for example. Increased die size may result in multiple localized hot spots on the die, and cooling ASICs with such die profiles is a challenge. Mitigation of hot spots and heat removal may result in a need for both heat spreading and heat conduction in single and multiple dimensions, which may be followed by natural, mixed, or forced convection. Heat spreading may be achieved with heat conductors that possess high thermal conductivity in at least two directions (i.e., in a plane). Graphene provides high thermal conductivity in a plane and is therefore a good material for use as a heat spreader. Even though layers of graphene demonstrate very high in-plane thermal conductivity, stacking layers of graphene significantly decreases the through-plane thermal conductivity. Thus, the through-plane heat conductivity of graphene is less than desirable for a heat conductor that may be used as a heat sink or an ASIC lid.

The embodiments described herein provide a graphene and carbon nanotube (CNT) based thermal management device. As described below, the superior in-plane thermal conductivity of graphene is combined with the high thermal conductivity of CNTs in the through-plane direction. CNT structures provide directional high thermal conductivity when the CNTs are properly arranged in a specific direction in the structure. The assembly of graphene layers and carbon nanotubes may be used as a passive thermal management element such as a heat sink or cold plate base that improves thermal performance considerably by utilizing superior heat spreading capabilities of graphene and directional heat conduction capabilities of carbon nanotubes. In addition to providing a lightweight solution, the thermal management device may eliminate the need for low thermal conductivity elements such as at least one layer of thermal interface material. As described in detail below, the thermal management device may be implemented to cool hot spots on a chip by vertical and horizontal heat transfer.

Referring now to the drawings, and first to FIG. 1, a schematic side view of a thermal management device 10 is shown, in accordance with one embodiment. The thermal management device 10 comprises a heat sink base 12 and heat sink fins 14 defining a single element (unit, piece) formed from a plurality of graphene layers with carbon nanotube arrays interposed between the graphene layers. For example, each of the heat sink fins 14 may include any number of graphene layers with any number of CNTs interposed between the graphene layers or extending therethrough as shown in FIGS. 2B and 2C, depending on the height, width, and thickness of the fins.

In one or more embodiments, the heat sink base 12 may comprise a pedestal 16 extending downward therefrom for direct contact with an integrated circuit package. The pedestal 16 of the base 12 may, for example, replace an integrated circuit package lid (cover) and thermal interface material (TIM) (also referred to as TIM2) for direct contact with a lidless integrated circuit package, as described below with respect to FIGS. 3-5. The heat sink 10 transfers heat generated by the integrated circuit package, which may one or more components in which heat dissipation capability of the component is insufficient to moderate its temperature. The heat sink base 12 and fins 14 allow excess thermal energy to dissipate into the environment by conduction. The heat sink 10 is configured to maximize the surface area in contact with a cooling medium (e.g., air, liquid) surrounding the heat sink and may be used to dissipate heat from an integrated circuit package comprising one or more ASIC, NPU (Network Processing Unit), chip, die, integrated circuit, photonic chip, electronic component, optical component, or other heat generating component or combination of heat generating components.

It is to be understood that the thermal management device shown in FIG. 1 is only an example, and other shapes, sizes, or types of heat sinks may be used without departing from the scope of the embodiments. The heat sink 10 may have any shape (e.g., height, width, length, ratio of width to length, base footprint, base thickness, number of fins, size of fins, shape or thickness of pedestal, or number of pedestals). In one example, the fins are 0.4 mm thick (e.g., between 0.2 mm and 0.6 mm thick). Also, the thermal management device may comprise a base plate of a cold plate, vapor chamber, or other thermal management device.

Figure 2A:
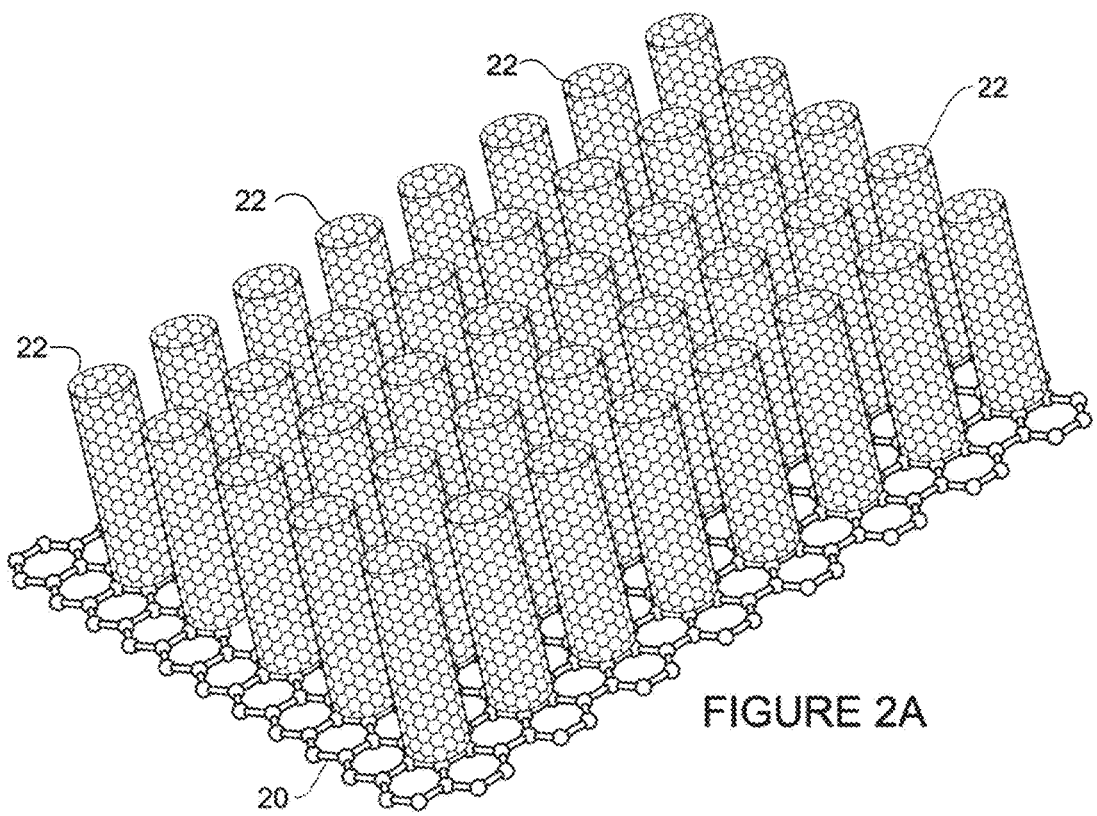
FIG. 2A is a schematic perspective of a graphene layer and carbon nanotube array, in accordance with one embodiment.
Figure 2B:
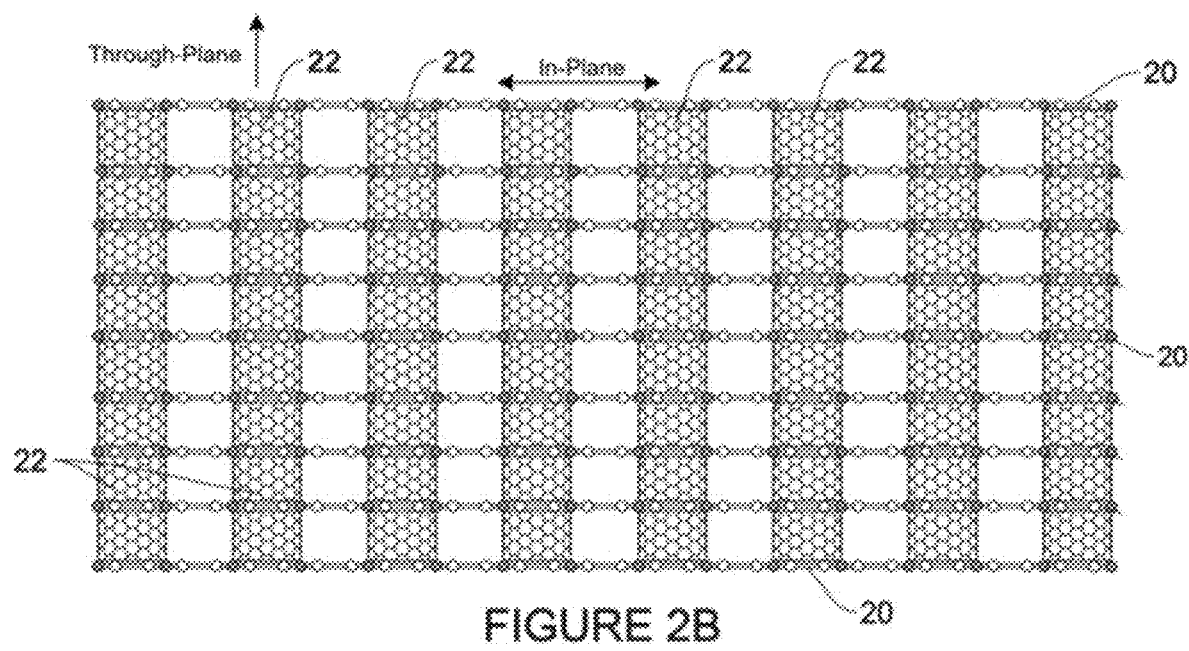
FIG. 2B is a schematic side view of a plurality of graphene layers with the carbon nanotubes interposed therebetween.

Referring now to FIGS. 2A, 2B, and 2C, examples of graphene layers 20 and carbon nanotubes 22 are schematically shown, in accordance with one embodiment. Perforated, thin, stacked graphene layers (sheets) 20 are filled in between with CNTs 22 to provide a composite structure with very good thermal transfer characteristics. As shown in FIG. 2B, a plurality of carbon nanotubes 22 are arranged with a plurality of graphene layers 20 (e.g., comprising one graphene sheet). This structure may include any number of graphene layers 20 with any number of carbon nanotubes 22 to build an element corresponding to the thermal management device (e.g., height of base plus fins). In one example, each CNT 22 may form a chain in a height (through-plane) direction with multiple layers of graphene 20 around it (i.e., the CNT structure does not have to terminate at individual graphene layers).

FIG. 2C schematically illustrates another example structure comprising a plurality of graphene layers 20 and CNTs 22 with some of the CNTs offset between layers. One or more CNTs 22 may extend inline through one or more graphene layers 20, one or more CNTs may be offset between one or more graphene layers, or any combination thereof. It is to be understood that the arrangement of graphene layers 20 and CNTs 22 shown in FIG. 2C is only an example and the CNTs may be arranged in many other configurations, without departing from the scope of the embodiments. For example, as previously noted, the CNT 22 may extend through two or more graphene layers 20, or the CNTs may be offset between each layer. Also, one or more of the CNT arrays between the graphene layers 20 may comprise a different number or spacing of CNTs 22.

In one example, each CNT 22 comprises a first end in thermal contact with a first graphene layer 20 and a second end in thermal contact with a second graphene layer. Each end of the CNT 22 may be covalently bonded to the respective graphene layer 20. For example, the graphene layer 20 may undergo an atomic substitution reaction in which the carbon nanotubes 22 are directly infused to create a three-dimensional structure from the graphene layer and the carbon nanotubes. In one example, the CNTs 22 are single-walled carbon nanotubes. The covalent bonds are defined by carbon-carbon bonds at one or more intersections between each CNT 22 and the adjacent graphene layers 20. As previously noted, there may also be multiple layers of graphene around the CNT 22, in addition to the graphene layers 20 at each end of the CNT. Thus, the CNT 22 may be covalently bonded to one or more of the graphene layers or extend through or connect with one or more of the graphene layers.

The first graphene layer 20 provides a large contact area to transfer heat from the surface of the integrated circuit package in direct contact with the thermal management device. While graphene has an outstanding in-plane thermal conductivity, its through-plane (cross-plane) heat transfer (i.e., perpendicular to the graphene plane) is hindered by a large inter-layer thermal resistance. The hybrid graphene and carbon nanotube structure described herein significantly reduces the interlayer thermal resistance in the normal direction between the graphene layers. High thermal conductivity is provided in-plane from the graphene layers (e.g., $k_{in\text{-}plane}$ up to 2000 W/mK) and in the normal (through-plane) direction from the CNTs (e.g., $k_{normal}$ up to 200 W/mK) to provide thermal conductivity in all directions. Improvement in the through-plane (CNT) thermal conductivity and in-plane (graphene) thermal conductivity provides a reduction in thermal resistance, resulting in high thermal conductivity of the thermal management device, thereby enabling sufficient cooling of the integrated circuit package (e.g., ASIC, NPU (Network Processing Unit) or other chip, die, integrated circuit, photonic chip, electronic component, optical component, or electrical/optical component). Graphene also provides advantages in strength and the composite structure is lightweight (e.g., at least 20-25% lower density than that of aluminum and about 80% lower density than that of copper).

As previously noted with respect to FIG. 1, the thermal management device (heat sink element) may include any number of graphene layers and any number of CNTs interposed between the layers depending on the size of the heat sink element. The stacked tiers of graphene layers and CNT arrays extend from a bottom surface of the heat sink element to a top of the heat sink element (e.g., top edge of heat sink fins) and are included in each integrated portion of the heat sink element. For example, the heat sink base, pedestal, and fins each comprise a plurality of graphene layers and CNT arrays interposed therebetween It is to be understood that the schematic depiction shown in FIGS. 2A-2C are only examples, and the relative size of the carbon nanotubes 22 and thickness of the graphene layers 20 or spacing and position of the nanotubes relative to each other in an array or between arrays may be different than shown, without departing from the scope of the embodiments. For example, the arrangement of the carbon nanotubes 22 may be based on a desired density of the hybrid structure, which may be defined by the percentage of an area of the graphene layer 20 bonded to the carbon nanotubes 22. The thermal conductivity of the carbon nanotube array may also depend on the length of the carbon nanotubes, which may be optimized based on implementation and environment of the thermal management device. Any suitable length or diameter of carbon nanotubes or process to grow the heat sink element may be used. In one or more embodiments, the structure shown in FIG. 2B may be positioned offset at an angle within the thermal management device (e.g., graphene layer offset from surface of heat sink base) to provide a different thermal conductivity profile in the heat sink. Also, fin pitch and thickness may be optimized for thermal management.

Figure 3:
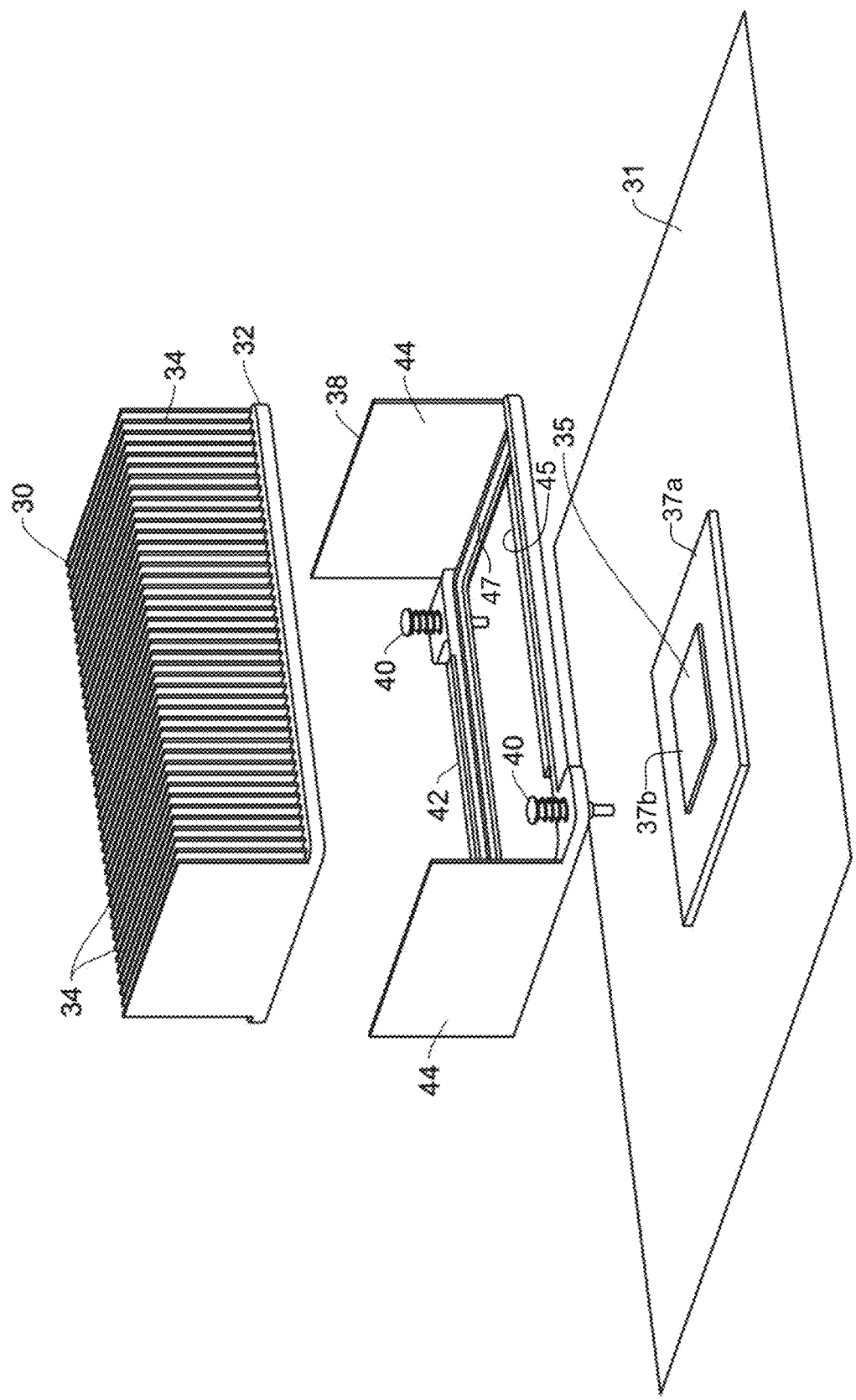
FIG. 3 is an exploded view of a graphene and carbon nanotube heat sink, a heat sink protector, and an integrated circuit package on a printed circuit board, in accordance with one embodiment.

FIG. 3 is an exploded view of a thermal management device and printed circuit board, in accordance with one embodiment. In one embodiment, an apparatus comprises the printed circuit board 31, an integrated circuit package 35 (substrate 37a, die 37b) mounted on the printed circuit board, a heat sink 30 formed from a plurality of graphene layers with carbon nanotubes interposed between the graphene layers, and a frame 42 mounted on the printed circuit board. The heat sink 30 is positioned on the frame 42 and in direct contact with the integrated circuit package 35 through an opening 45 in the frame 42.

Figure 4:
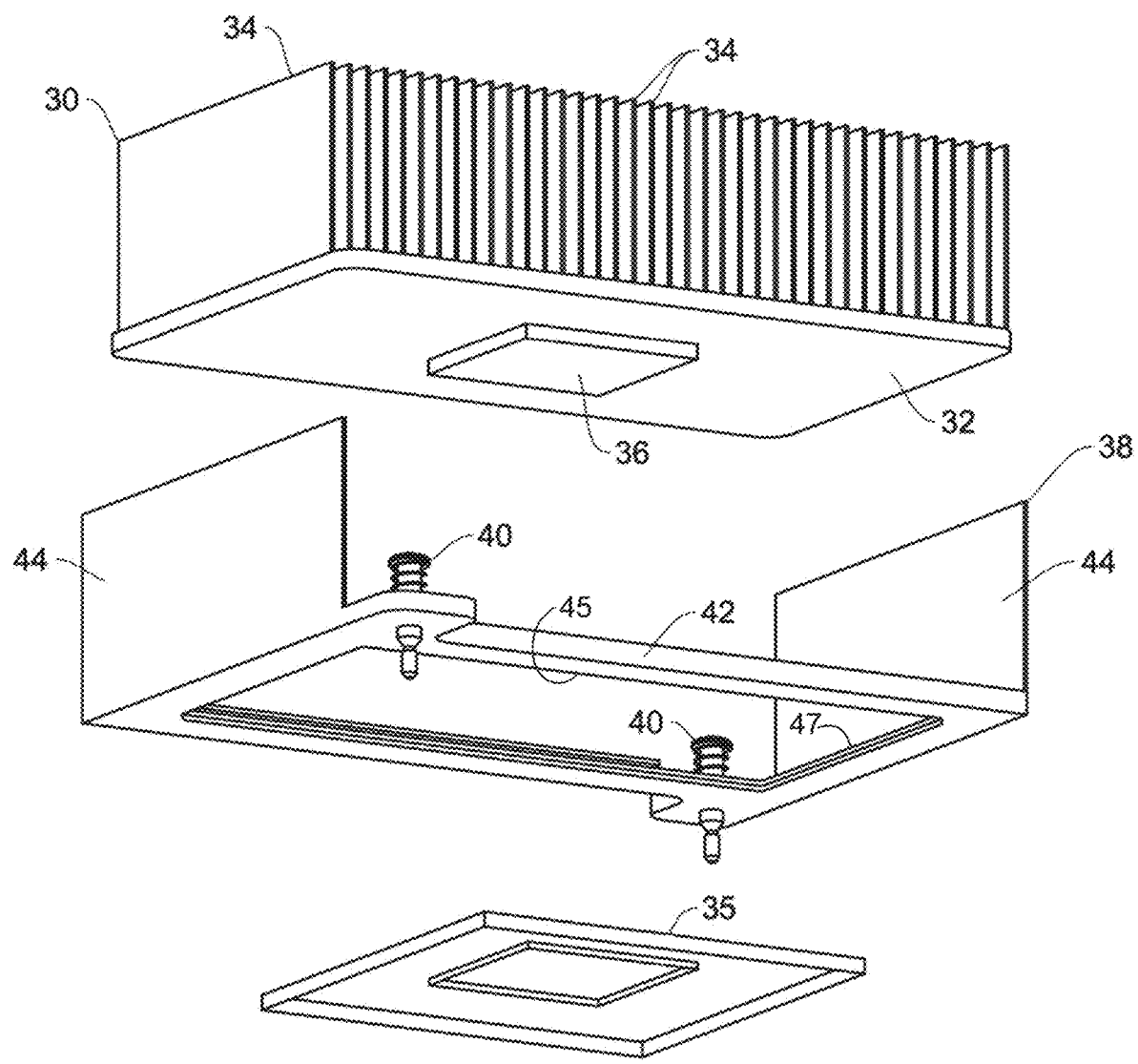
FIG. 4 is a bottom perspective of the exploded view shown in FIG. 3 with the printed circuit board removed.
Figure 5:
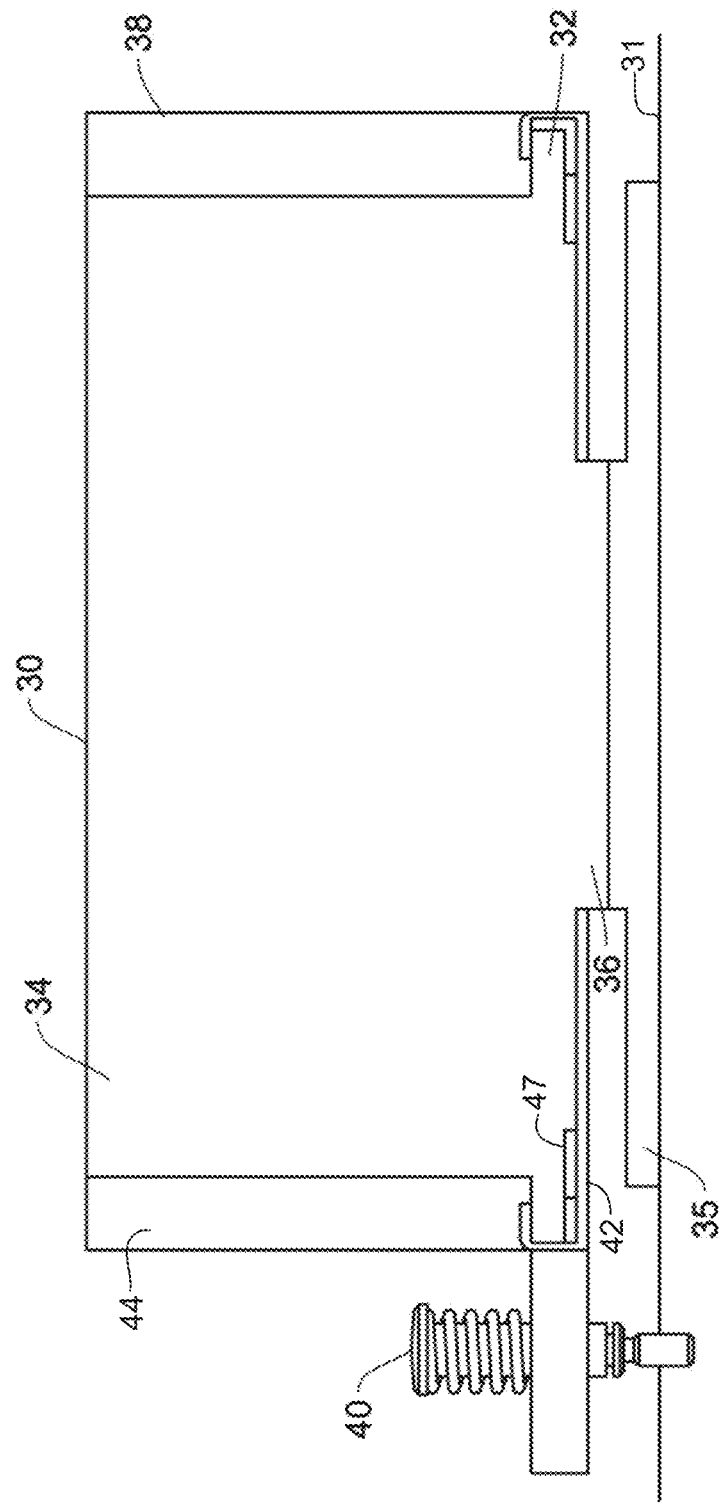
FIG. 5 is a cross-sectional view of the assembled heat sink and fin protector mounted on the integrated circuit package of FIG. 3.

In the example shown in FIGS. 3-5, the thermal management device includes an integrated graphene and carbon nanotube heat sink 30 comprising a heat sink base 32 and heat sink fins 34 extending upward from the base. As previously described, the heat sink 30 is formed as a single unit from multiple layers of graphene with carbon nanotubes interposed between the layers. The heat sink base 32 thermally couples the integrated circuit package 35 to the heat sink and fluid (e.g., airflow provided by one or more fans or a cooling liquid) flows across the fins 34. The heat sink base 32 transfers heat to the heat sink fins 34 and the fluid carries heat away from the heat sink 30 as it travels past the fins, thereby cooling the integrated circuit package 35.

A heat sink protector 38 is provided to protect the heat sink 30 (e.g., protect thin fins 34 of the heat sink and protect heat sink from shock or vibration). The heat sink protector 38 comprises the frame 42 for mounting on the printed circuit board 31 and supporting the heat sink base 32. In the example shown in FIGS. 3-5, the heat sink protector 38 further comprises side walls 44 (e.g., two or more side walls extending upward from the frame and positioned adjacent to outer fins 34). The side walls 44 may be formed, for example, from an aluminum material and comprise a 1 mm thick wall (or formed from any other suitable material with any wall thickness). The base 32 of the heat sink 30 sits within the frame 42 and is in contact with the integrated circuit package 35 through opening 45 in the frame. The frame 42 may be attached to printed circuit board 31 with one or more fasteners 40 (e.g., screws, spring loaded screws, or any other suitable fastener). The frame 42 preferably comprises a shock absorbing material 47 (e.g., gasket extending around inner periphery of frame) to reduce amplitude or vibration quickly and effectively and protect the heat sink 30. The frame 42 is positioned over the integrated circuit package 35 mounted on PCB 31. In one or more embodiments, the package 35 is a lidless integrated circuit package and the thermal management device is configured for direct contact with the integrated circuit package without a thermal interface material (TIM2) interposed therebetween.

The printed circuit board 31 may be any type of conductive platform or board for installing and electrically connecting electrical and mechanical components to create an electrical circuit. The circuit board 31 may be securely positioned within a housing and have one or more integrated circuit packages installed thereon. One or more thermal management devices may be attached to the circuit board and positioned over one or more heat generating components. The printed circuit board 31 may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). The traces, pads, and electronic components may be arranged in any configuration to perform any number of functions (e.g., network server card, graphics card, motherboard, device card (line card, fabric card, controller card), and the like) for operation on any type of network device (e.g., computer, router, switch, server, gateway, controller, edge device, access device, aggregation device, core node, intermediate node, or other network device). The circuit board 31 may be located within a line card, fabric card, controller card, or other modular device, including, for example, 1RU (rack unit), 2RU, or other size modular device.

FIG. 4 is a bottom perspective of the heat sink 30, heat sink protector 38 (frame 42, fin protector 44) and lidless package 35 of FIG. 3. A pedestal 36 is integrally formed with the base 32 of the heat sink for direct contact with the die of the integrated circuit package 35. As previously described, the pedestal 36 is part of the one piece element formed from the graphene layers and carbon nanotube arrays, and may replace a lid and thermal interface material.

FIG. 5 is a cross-sectional view of the assembled thermal management device of FIG. 3. As previously described, the pedestal 36 is integrally formed with the heat sink base 32 and fins 34. The heat sink base 32 is supported by the frame 42 comprising the shock absorbing material 47 and outer heat sink fins 34 are positioned adjacent to the side walls 44 (FIGS. 3 and 5).

It is to be understood that the thermal management device shown in FIGS. 3-5 is only an example. Also, it should be noted that the terms, downward, upward, bottom, top, lower, upper, below, above, and the like as used herein are relative terms dependent upon orientation of the printed circuit board and should not be interpreted in a limiting manner. These terms describe points of reference and do not limit the embodiments to any particular orientation or configuration.

Figure 6A:
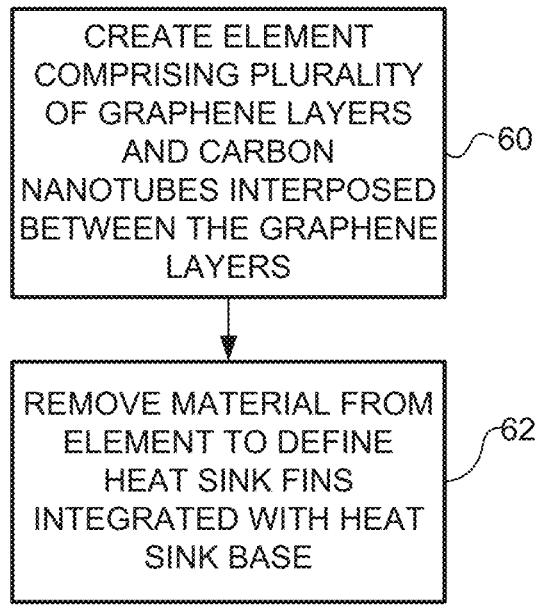
FIG. 6A is a flowchart illustrating an overview of a process for making the graphene and carbon nanotube based heat sink, in accordance with one embodiment.

FIG. 6A is a flowchart illustrating an overview of a process for manufacturing the thermal management device, in accordance with one embodiment. At step 60, an element is created comprising a plurality of graphene layers and carbon nanotubes interposed between the graphene layers. Material is removed from the element to define heat sink fins integrated with a heat sink base (step 62). As previously described, the graphene layers provide in-plane thermal conductivity and the carbon nanotubes provide through-plane thermal conductivity. In one or more embodiments, the graphene layers may be offset from a surface of the heat sink base to optimize thermal conductivity. As previously described, the heat sink base with the integrated heat sink fins may be mounted on a frame attached to a printed circuit board with the heat sink base (e.g., pedestal of the heat sink base) in direct contact with an integrated circuit package through an opening in the frame. The frame may comprise a shock absorbing material and at least two walls extending upward therefrom to protect the heat sink fins.

Figure 6B:
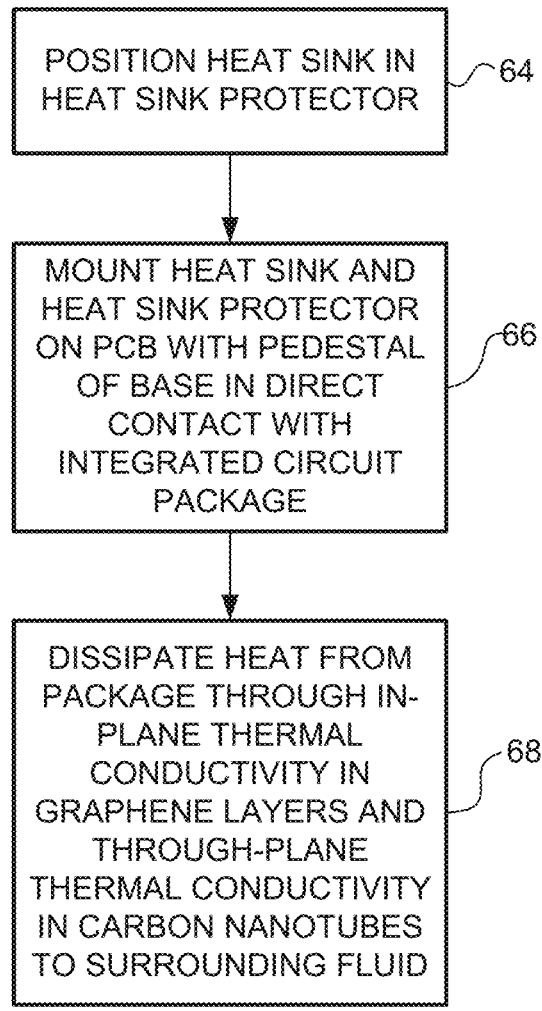
FIG. 6B is a flowchart illustrating an overview of a process for heat dissipation with the graphene and carbon nanotube heat sink, in accordance with one embodiment.

FIG. 6B is a flowchart illustrating an overview of a process for implementing the thermal management device, in accordance with one embodiment. At step 64, the heat sink is positioned in the heat sink protector. The heat sink and heat sink protector are mounted on the printed circuit board with a pedestal of the base in direct contact with the integrated circuit package (step 66). Heat is dissipated from the integrated circuit package through in-plane thermal conductivity in the graphene layers and through-plane thermal conductivity in the carbon nanotubes to surrounding fluid (air, liquid) (step 68).

It is to be understood that the processes shown in FIGS. 6A and 6B are only examples, and steps may be added, modified, combined, removed, or reordered without departing from the scope of the embodiments. For example, the frame may first be attached to the PCB and the heat sink inserted into the mounted frame.

As can be observed from the foregoing, the thermal management device described herein provides many advantages. For example, the integrated graphene and carbon nanotube based heat sink may eliminate drawbacks with conventional heat sinks such as flatness, high contact resistance, vapor chamber dry-out, or the need for a thermal management interface. In one example, an improvement of thermal performance of 45% may be provided while reducing the weight by at least 30% compared to a traditional vapor chamber/parallel plate fin assembly.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A thermal management device comprising:
a heat sink base; and
heat sink fins;
wherein the heat sink base and heat sink fins comprise a single element formed from a plurality of graphene layers with carbon nanotubes interposed between the plurality of graphene layers, wherein a first carbon nanotube of the carbon nanotubes is interposed between a first graphene layer of the plurality of graphene layers and a second graphene layer of the plurality of graphene layers, a second carbon nanotube of the carbon nanotubes and a third carbon nanotube of the carbon nanotubes are interposed between the second graphene layer and a third graphene layer, and the first carbon nanotube is offset from the second carbon nanotube such that a first portion of the first carbon nanotube is positioned above the second carbon nanotube and a second portion of the first carbon nanotube is positioned above an area between the second carbon nanotube and the third carbon nanotube.

2. The thermal management device of claim 1 wherein the heat sink base comprises a pedestal for direct contact with an integrated circuit package.

3. The thermal management device of claim 2 wherein the integrated circuit package comprises a lidless integrated circuit package.

4. The thermal management device of claim 1 further comprising a frame configured for mounting on a printed circuit board and supporting the heat sink base.

5. The thermal management device of claim 4 wherein the frame comprises a shock absorbing material.

6. The thermal management device of claim 4 further comprising at least two side walls extending upward from the frame and positioned adjacent to the heat sink fins.

7. The thermal management device of claim 1 wherein the thermal management device is configured for direct contact with an integrated circuit package without a thermal interface material interposed therebetween.

8. An apparatus comprising:
a printed circuit board;
an integrated circuit package mounted on the printed circuit board;
a heat sink formed from a plurality of graphene layers with carbon nanotubes interposed between the plurality of graphene layers, wherein a first carbon nanotube of the carbon nanotubes is interposed between a first graphene layer of the plurality of graphene layers and a second graphene layer of the plurality of graphene layers, a second carbon nanotube of the carbon nanotubes and a third carbon nanotube of the carbon nanotubes are interposed between the second graphene layer and a third graphene layer of the plurality of graphene layers, and the first carbon nanotube is offset from the second carbon nanotube such that a first portion of the first carbon nanotube is positioned above the second carbon nanotube and a second portion of the first carbon nanotube is positioned above an area between the second carbon nanotube and the third carbon nanotube; and
a frame mounted on the printed circuit board, wherein the heat sink is positioned on the frame and in direct contact with the integrated circuit package through an opening in the frame.

9. The apparatus of claim 8 wherein the heat sink comprises heat sink fins integrated with a heat sink base.

10. The apparatus of claim 9 wherein the frame comprises at least two side walls extending upward therefrom for protection of the heat sink fins.

11. The apparatus of claim 9 wherein the heat sink base comprises a pedestal in direct contact with the integrated circuit package.

12. The apparatus of claim 11 wherein the pedestal replaces a thermal interface material and a lid of the integrated circuit package.

13. The apparatus of claim 8 wherein the integrated circuit package comprises a lidless integrated circuit package.

14. The apparatus of claim 8 wherein the frame comprises a shock absorbing material.

15. The apparatus of claim 8 wherein the heat sink is in direct contact with the integrated circuit package without a thermal interface material interposed therebetween.

16. A method comprising:
creating an element comprising a plurality of graphene layers and carbon nanotubes interposed between the plurality of graphene layers; and removing material from the element to define heat sink fins integrated with a heat sink base;

wherein the plurality of graphene layers provide in-plane thermal conductivity and the carbon nanotubes provide through-plane thermal conductivity.

17. The method of claim 16 wherein the heat sink base comprises a pedestal for direct contact with an integrated circuit package.

18. The method of claim 16 further comprising positioning the plurality of graphene layers offset from a surface of the heat sink base to optimize thermal conductivity.

19. The method of claim 16 further comprising mounting the heat sink base with the heat sink fins on a frame attached to a printed circuit board, wherein the heat sink base is in direct contact with an integrated circuit package through an opening in the frame.

20. The method of claim 19 wherein the frame comprises a shock absorbing material and at least two walls extending therefrom to protect the heat sink fins.

* * * * *